United States Patent [19]

Hogge, Jr. et al.

[11] Patent Number: 4,788,512

[45] Date of Patent: Nov. 29, 1988

[54] GAIN MAINTENANCE APPARATUS FOR USE WITH A HIGH GAIN AMPLIFIER INCORPORATED IN A CLOSED LOOP FEEDBACK SYSTEM

[75] Inventors: Charles R. Hogge, Jr., Richardson; Karl A. Ireland, Plano, both of Tex.

[73] Assignee: Rockwell International Corporation, El Segundo, Calif.

[21] Appl. No.: 58,733

[22] Filed: Jun. 5, 1987

[51] Int. Cl.$^4$ ............................................. H03L 7/16
[52] U.S. Cl. .................................... 331/4; 331/17; 331/25
[58] Field of Search .................. 331/4, 17, 25, DIG. 2

[56] References Cited

FOREIGN PATENT DOCUMENTS 0144240 12/1978 Japan ..................................... 331/4
0133371 8/1982 Japan ..................................... 331/4

Primary Examiner—Gene Wan
Attorney, Agent, or Firm—Bruce C. Lutz; V. Lawrence Sewell; H. Fredrick Hamann

[57] ABSTRACT

When there is a loss of tracking in a signal tracking system, such as a phase-lock loop, some components of the system, such as high gain amplifiers, will tend to have their outputs driven to the rail. When the output of an amplifier used to drive a voltage controlled oscillator in a phase-lock loop is driven to the rail, not only is its gain reduced to a very low value but additionally this rail voltage will interfere with the signal reacquisition process of the system. The present invention detects when system conditions are such that the amplifier could change to a low gain condition, and provides feedback around the high gain amplifier during those conditions to keep its output substantially centered until the system reestablishes a tracking mode.

3 Claims, 1 Drawing Sheet

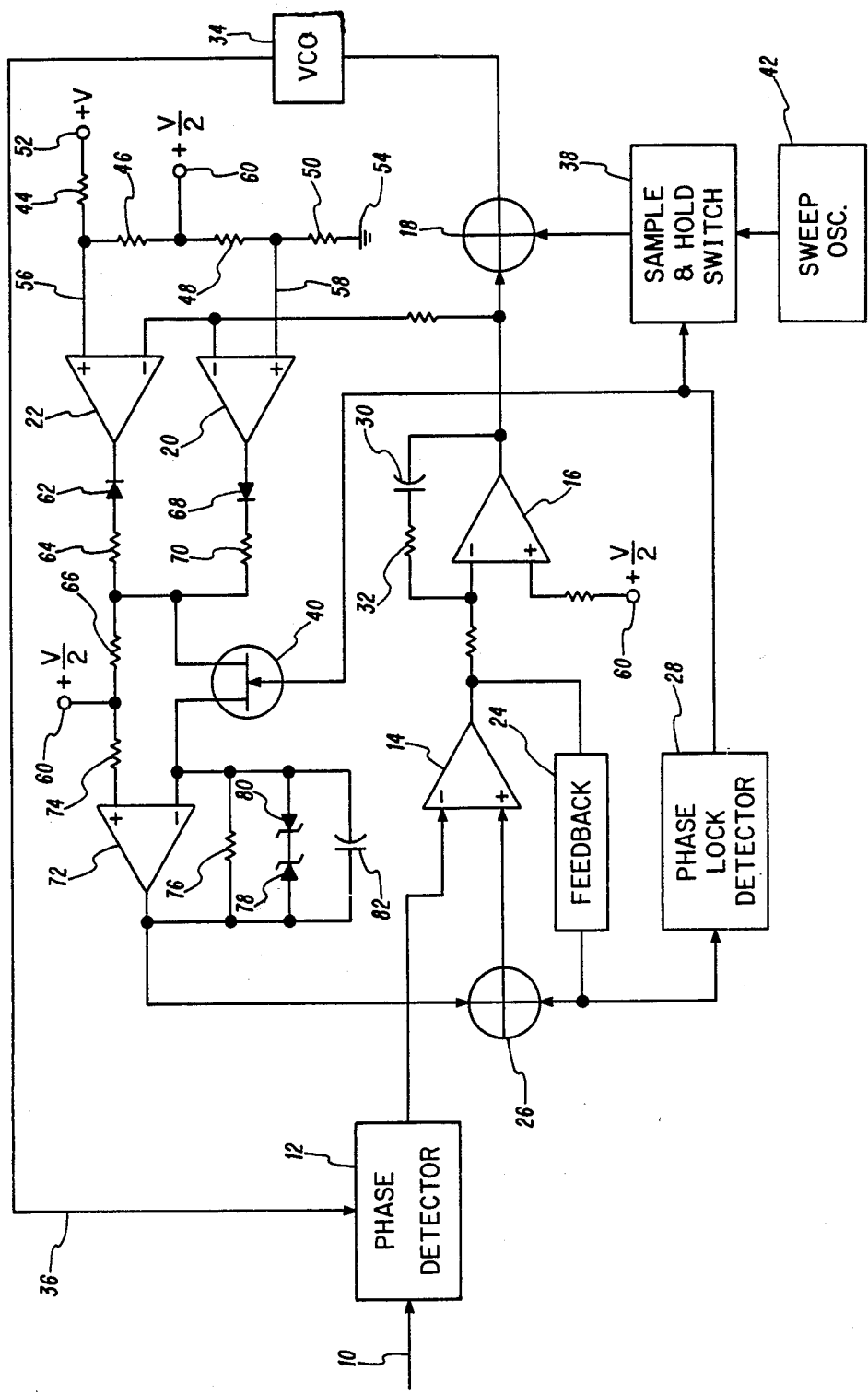

GAIN MAINTENANCE APPARATUS FOR USE WITH A HIGH GAIN AMPLIFIER INCORPORATED IN A CLOSED LOOP FEEDBACK SYSTEM

THE INVENTION

The present invention is generally concerned with electronics, and more specifically concerned with a phase-lock loop. Even more specifically, it's concerned with a phase-lock loop, which loop contains a VCO which receives a phase-lock input signal from a high gain amplifier during normal signal tracking operations and receives a sweep signal from a sweep oscillator during the process of reestablishing signal tracking conditions and which amplifier may tend to revert to a low gain condition while the system is attempting to reestablish signal tracking conditions.

BACKGROUND

When a high gain amplifier is used in a closed loop system, such as a phase-lock loop, and the system is in a non-linear mode, such as occurs when a phase-lock loop is out of lock, the high gain amplifier typically reverts to a low gain mode. This occurs when loop transients and beat note signals change the amplifier's output to a voltage close to one of its supply voltages, either positive or negative, from the amplifier's normal output voltages. A term used by those skilled in the art to define this condition is "going to the rails".

One example of the above is a system where a Type 2 second order phase-lock loop is attempting to recreate a clock signal from an incoming data signal. The phase-lock loop typically incorporates a phase detector of some sort, which provides an output signal through an active loop filter containing a high gain amplifier to drive a voltage controlled oscillator to a phase and frequency which is identical with that of the clock originally used to clock the data of the incoming signal being compared. In normal operation, the gain of the amplifier is quite high and is at an output value which is some median point between power supply voltages. When the phase-lock condition is interrupted due to some influence such as noise or loss of signal to be compared, a sweep signal outside normal loop operation may be utilized to reestablish a phase-locked condition. However, if the sweep signal is summed with the output of the high gain amplifier to be applied to the VCO, and if further the high gain amplifier has gone "to the rails", the rail voltage interferes with the prompt reacquisition of synchronization.

A known prior art attempt to correct this condition is to connect opposite polarity diodes in parallel and to connect that combination from the output to the input of the high gain amplifier as a type of electronic clamp. Such a solution may work to limit the output excursion of the amplifier, but such a solution cannot hold the output of the high gain amplifier closer than an integral number of diode drops away from the final value so a slower sweep rate, higher amplitude sweep voltage is required and, thus, reacquisition of phase lock is made slower. Where the high gain amplifier comprises part of a filter network as well, the parallel connection of the diodes may affect the closed loop transfer function by shunting a critical network with a finite leakage path.

The present invention overcomes the limitations of the prior art by activating a circuit which is operational only when there is a detection that the phase-lock loop is no longer in a phase-locked condition, and providing a feedback signal to the input of the high gain amplifier to keep it driven towards a central value as ascertained by a pair of reference voltages on either side of a "normal" output voltage of the high gain amplifier. As soon as phase-lock is reestablished, the feedback circuit is deactivated and the system can revert to normal operation.

It is thus an object of the present invention to provide an improved approach to prevent a high gain amplifier in a closed loop system from reverting to a low gain condition and to limit the excursions of the output of said amplifier.

Other objects and advantages of the present invention will be apparent from a reading of the specification and appended claims in conjunction with the single drawing, which is a combination block-schematic diagram of one embodiment of the invention as applied to a phase-lock loop system.

DETAILED DESCRIPTION

In the drawing, a data signal is input on a lead 10 to a phase detector 12 having an output supplied to an inverting input of a first amplifier 14 which supplies signals to an inverting input of a further amplifier 16. An output of amplifier 16 is supplied to a summing circuit 18 as well as being supplied to inverting inputs of a pair of amplifiers 20 and 22. Amplifier 14 is illustrated as having a feedback circuit 24 supplying signals from the output of amplifier 14 to a summing circuit 26 and to an input of a phase-lock detector 28. The amplifier 14 and feedback circuit 24 comprise an oscillator circuit which oscillates only when the phase-lock loop is not phase-locked. Details as to this portion of the circuit and as to the remaining blocks of the total figure may be found in co-pending patent applications in the names of the present inventors filed Apr. 23, 1987, and having Ser. Nos. 041,892 and 041,897. The amplifier 16 has a feedback loop comprising a capacitor 30 and a resistor 32 whereby the combination, in conjunction with the amplifier input resistor, performs the function of a filter. An output of summing circuit 18 is supplied to a voltage controlled oscillator (VCO) 34 which supplies a feedback signal on a lead 36 to the phase detector 12. The phase-lock detector 28 provides an output signal to a sample and hold switch 38 as well as to a field effect transistor or switch 40. The sample and hold switch 38 receives an input from a sweep oscillator block 42 and provides an output signal as a second input to summing means 18. A set of resistors 44, 46, 48 and 50 are connected between a positive power supply terminal 52 and ground 54 to provide first and second reference potentials on leads 56 and 58 as shown. An additional positive terminal designated as 60 provides substantially half the voltage with respect to ground 54 as that appearing on lead 52. The lead 56 is connected to a non-inverting input of amplifier 22 and lead 58 is connected to a non-inverting input of amplifier 20. In one embodiment of the invention, the resistance of resistors 46 and 48 was very small compared to the value of resistors 44 and 50. A diode 62 is connected in series with a resistor 64 as shown between an output of amplifier 22 and a source lead of FET 40. A resistor 66 is connected between positive power terminal 60 and the same source lead of FET 40. A further diode and resistor combination comprising components 68 and 70 are connected as shown between the output of amplifier 20 and the source lead of transistor 40. The drain lead of transistor 40 is connected to an inverting input of an amplifier 72. The non-inverting input of this amplifier is connected through a resistor 74 to positive power terminal 60. The amplifier 72 has a feedback resistor 76 and a pair of zener diodes connected in parallel with resistor 76. The zener diodes are back to back and are generally designated as 78 and 80. A capacitor 82 is also connected in parallel with feedback resistor 76. An output of amplifier 72 is connected as a second input to summing means 26.

OPERATION

As mentioned previously in the brief discussion, a signal tracking system, such as a phase-lock loop, often includes an amplifier, such as 16, which is used to drive a variable device such as VCO 34. As long as there is feedback and a signal on lead 10 to detect so that the VCO 34 can be driven to a frequency substantially identical with the clock signal used to generate the data stream in the first place, feedback will keep the output of amplifier 16 at a value which is substantially midway between the voltage extremes used to power the amplifier. However, when the tracking system loses synchronization, noise in the system will typically tend to drive the output of the amplifier, such as 16, to one of its voltage limits, either positive or negative. Such a condition lowers the gain of the amplifier to a very low value, but even more detrimental is the fact that this limiting voltage is applied to the VCO during the attempt to reacquire synchronization. When the system loses lock, the phase lock detector 28 detects such a condition and applies a control signal to a sample and hold switch 38, which allows the sweep signal from block 42 to be applied to VCO 34 in addition to the signal from the amplifier 16. Without the circuitry of the present invention, the VCO then tries to provide a feedback signal on lead 36 to counteract the amplifier output or in other words drive the output of amplifier 16 back from the limiting value to a normal operational value, but would fail. The present invention adds the circuitry, shown in detail, to the circuits of the referenced inventions so that upon detection of an out-of-lock condition, the switch 40 is activated and signals from one of the amplifiers 20 and 22 may be passed through switch 40 to amplifier 72 and applied to the non-inverting input of amplifier 14.

As previously mentioned, the resistors 46 and 48, in one embodiment of the invention, were very small compared with resistors 44 and 50. Thus the referenced voltages supplied on leads 56 and 58 were only slightly above and slightly below the voltage on lead or terminal 60. It may be assumed for the moment that the center voltage is five volts on lead 60, and thus the voltage on leads 56 and 58 are 5.1 volts and 4.9 volts. If the output from amplifier 16 is exactly 5 volts, the inverting input of amplifier 22 will be of a lower absolute magnitude than a non-inverting input and thus the output will be a large, positive voltage. The connection of diode 62 will prevent the output from being applied to the switch 40. On the other hand, the output of amplifier 20 will be a large negative voltage, since the absolute amplitude at the non-inverting input is smaller than that at the inverting input for this amplifier. Again, the negative signal at the output of amplifier 20 will not be applied to switch 40.

It may be assumed that, in an out of lock condition, transients, beat notes and noise drives the output of amplifier 16 in a positive direction, so that it exceeds the reference 5.1 volts appearing on lead 56. In this instance, the output of amplifier 22 will suddenly become negative and the signal will be applied through switch 40 and inverting amplifier 72 to the input of amplifier 14 to drive it whereby the output of amplifier 16 is lowered. The probable effect is that it will continue in a downward direction until the output is less than the 4.9 volt reference on lead 58. This will activate amplifier 20 to have a large positive output voltage and this signal will then be supplied through switch 40 and amplifier 72 to the input of amplifier 14. The output of amplifier 16 will thus typically produce a triangular output voltage varying between 4.9 and 5.1 volts while the sweep signal from oscillator 42 is being applied to VCO 34 to reacquire synchronization. This small triangular wave-shaped voltage has a much smaller detrimental effect on the resynchronization process than would a large voltage such as 10 volts or 0 volts if the VCO is set up to typically operate with an input of 5 volts.

A further advantage of this approach is that the circuitry shown is electrically connected in parallel with the feedback circuit for amplifier 16 being switched into operation only during the reacquisition process. Thus, it does not interfere with the transfer function of the filter utilizing amplifier 16 during normal phase-lock operation. The amplifier 14 is a low gain amplifier and merely forms a portion of the circuitry that is used to detect whether or not the loop is in a locked condition. However, since it does have some gain, the present circuitry is fed back in such a way as to include this amplifier.

While the present invention has been shown as applied only to a phase-lock loop type of signal tracking system, the same concept can be applied to other signal tracking systems, such as servo loops, etc.

In view of the above, we wish to be limited not by the single embodiment illustrated but only by the scope of the appended claims, wherein we claim.

1. Phase-lock loop apparatus comprising, in combination:
    phase detection first means;
    voltage controlled oscillator second means;
    third means, including high gain amplifier means and phase-lock detection means, for providing an output first signal when a lack of phase-lock of the loop is detected;
    fourth means connecting said first, second and third means in a phase-lock loop feedback arrangement where said high gain amplifier means comprises a direct part of the feedback path of the phase-locked loop and is connected to supply signals to drive said voltage controlled oscillator second means;
    sweep signal supplying fifth means, connected to said second and third means for supplying a sweep second signal to said second means while receiving said output first signal; and
    signal centering sixth means, connected in a signal feedback relation from an output to an input of said high gain amplifier portion of said third means and including a signal input means connected to said third means for receiving said first signal, for maintaining the voltage output of said high gain amplifier means at a substantially median value when the phase-lock loop is not in a locked condition.

2. Phase-lock loop apparatus comprising, in combination:
    phase detection first means;
    voltage controlled oscillator second means;

third means, including high gain amplifier means and phase-lock detection means, for providing an output first signal when a lack of phase-lock of the loop is detected;

fourth means connecting said first, second and third means in a phase-lock loop feedback arrangement where said high gain amplifier means comprises a direct part of the feedback path of the phase-lock loop and is connected to supply signals to drive said voltage controlled oscillator second means;

sweep signal supplying fifth means, connected to said second and third means for supplying a sweep second signal to said second means while receiving said output first signal; and signal centering sixth means, connected in a signal feedback relation from an output to an input of said high gain amplifier portion of said third means and including a signal input means connected to said third means for receiving said first signal and further including first and second reference potentials, for maintaining the voltage output of said high gain amplifier means at a value intermediate said first and second reference potentials when the phase-lock loop is not in a locked condition.

3. Apparatus of the class described comprising, in combination:

phase-lock loop apparatus including a voltage controlled oscillator which is normally driven in a feedback relation by a loop amplifier during phase-lock conditions and is driven in an acquisition mode by sweep signal supplying means external the loop when the loop is not in a phase locked condition; and signal centering means, connected in a signal feedback relation from an output to an input of said loop amplifier and further including first and second reference potentials, for maintaining the voltage output of said high gain amplifier means at a value intermediate said first and second reference potentials when the phase-lock loop is not in a locked condition.

* * * * *